US008169229B2

(12) United States Patent
Wang et al.

(10) Patent No.: US 8,169,229 B2
(45) Date of Patent: May 1, 2012

(54) ACTIVE DEVICE ARRAY AND TESTING METHOD

(75) Inventors: Chih-Chang Wang, Taichung County (TW); Chih-Ming Chang, Taichung (TW); Chun-Chieh Wu, Kaohsiung County (TW)

(73) Assignees: Dongguan Masstop Liquid Crystal Display Co., Ltd., Guangdong Province (CN); Wintek Corporation, Taichung (TW)

( * ) Notice: Subject to any disclaimer, the term of this patent is extended or adjusted under 35 U.S.C. 154(b) by 0 days.

(21) Appl. No.: 12/875,151

(22) Filed: Sep. 3, 2010

(65) Prior Publication Data

US 2011/0057680 A1 Mar. 10, 2011

(30) Foreign Application Priority Data

Sep. 4, 2009 (TW) ................................ 98129875 A

(51) Int. Cl.
*G01R 31/26* (2006.01)

(52) U.S. Cl. .......... 324/760.01; 324/760.02; 324/762.01

(58) Field of Classification Search ............ 324/760.02, 324/750.23, 761.01
See application file for complete search history.

(56) References Cited

U.S. PATENT DOCUMENTS

| | | | | |
|---|---|---|---|---|
| 7,145,358 | B2 * | 12/2006 | Ando | 324/760.01 |
| 7,274,352 | B2 * | 9/2007 | Yu | 345/100 |
| 7,298,165 | B2 * | 11/2007 | Chang et al. | 324/760.02 |
| 8,045,119 | B2 * | 10/2011 | Huang et al. | 349/149 |
| 2006/0152245 | A1 * | 7/2006 | Ahn et al. | 324/769 |
| 2007/0018680 | A1 * | 1/2007 | Jeon et al. | 324/770 |
| 2007/0182442 | A1 * | 8/2007 | Hata et al. | 324/770 |
| 2008/0238471 | A1 * | 10/2008 | Miyagawa et al. | 324/765 |

* cited by examiner

*Primary Examiner* — Richard Isla Rodas
(74) *Attorney, Agent, or Firm* — Jianq Chyun IP Office

(57) ABSTRACT

An active device array includes a plurality of scan lines, a plurality of data lines, a plurality of pixel structures, a first testing circuit, a second testing circuit, a third testing circuit and a fourth testing circuit. Each of the pixel structures is connected to one of the scan lines and one of the data lines. The first testing circuit is electrically connected to the odd scan lines; the second testing circuit is electrically connected to the (4n+1)th scan lines wherein n is zero or a positive integer; the third testing circuit is electrically connected to the even scan lines; the fourth testing circuit is electrically connected to the (4n+2)th scan lines.

10 Claims, 1 Drawing Sheet

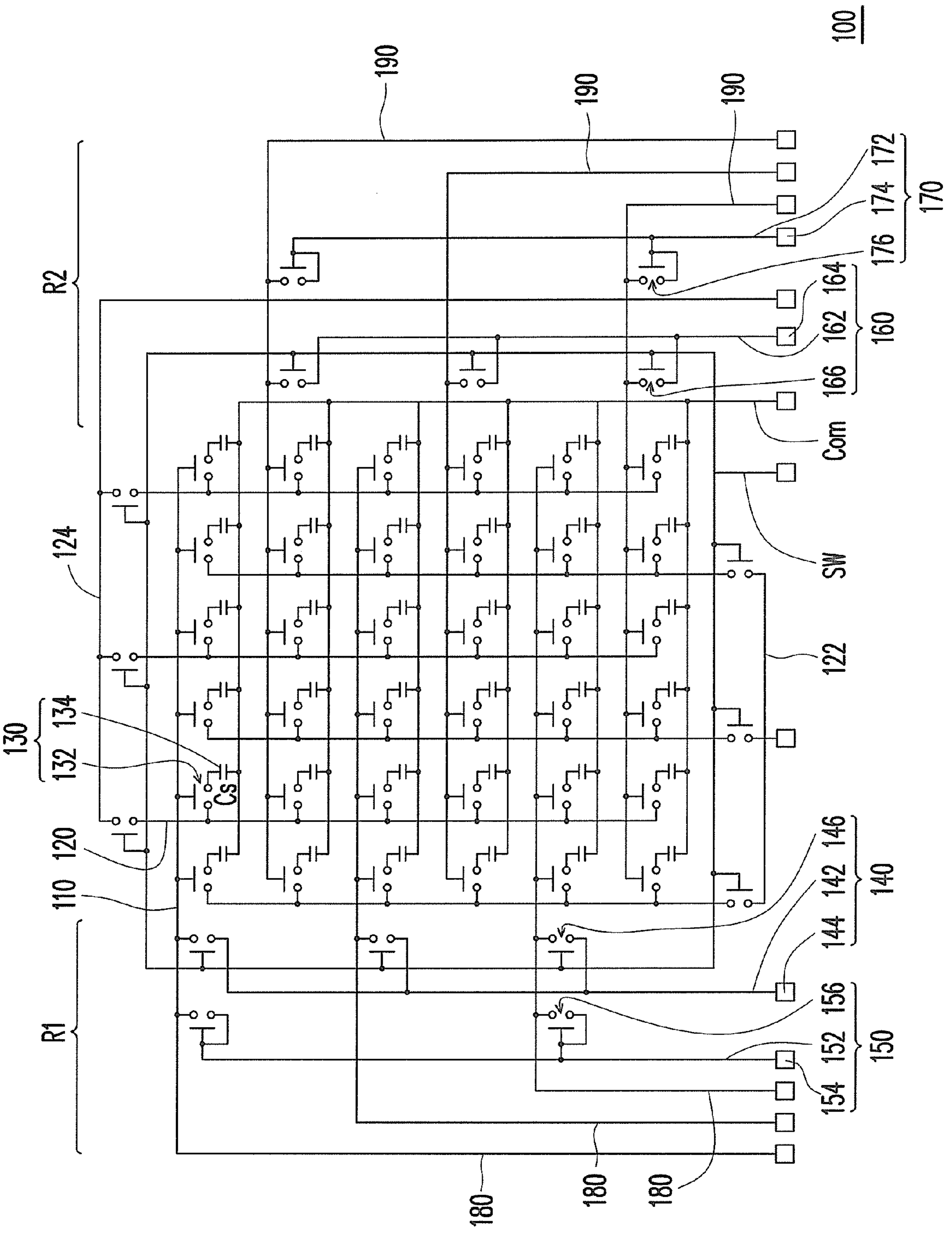
100
R2
R1
190
190
190
172
174
176
170
164
162
166
160
Com
SW
124
122
130
134
132
Cs
120
110
146
142
144
140
156
152
154
150
180
180
180

ACTIVE DEVICE ARRAY AND TESTING METHOD

CROSS-REFERENCE TO RELATED APPLICATION

This application claims the priority benefit of Taiwan application serial no. 98129875, filed on Sep. 4, 2009. The entirety of the above-mentioned patent application is hereby incorporated by reference herein and made a part of specification.

BACKGROUND OF THE INVENTION

1. Field of the Invention

The present invention generally relates to an active device array and a testing method, and more particularly, to an active device array and a testing method able to effectively inspect short-circuit defects.

2. Description of Related Art

A liquid crystal display panel (LCD panel) usually includes an active device array substrate, an opposite substrate, and a liquid crystal layer disposed between the above-mentioned two substrates. After the active device array substrate is completely fabricated, the active device array thereon must be tested so as to ascertain that the active device array substrate functions for displaying normally.

Currently, the above-mentioned testing of the active device array is mostly focused on judging whether or not the pixel structures of the active device array function for displaying normally. Once the circuits other than the pixel structure of the active device array have defects, for example, short-circuit or open-circuit, the defects are often tested and inspected after assembling the liquid crystal display (LCD) or the LCD panel.

In other words, the defects presented with some transmission circuits in an active device array are tested and inspected after assembling the LCD panel only, so that the defects make the product unable to normally run and the defective LCD panel including the active device array substrate, the opposite substrate, and the liquid crystal layer must be discarded as useless, which wastes the production cost a lot. In particular, in order to save the area of the wiring layout, many currently designed transmission circuits are arranged closely with each other; therefore, the short-circuit defects in the wiring layout of an active device array are more likely presented, which results in increasing the discarding rate of LCD panel and the production cost.

SUMMARY OF THE INVENTION

Accordingly, the present invention is directed to an active device array able to effectively inspect the defects between the circuits.

The present invention is also directed to a testing method able to inspect the short-circuit defects in an active device array.

The present invention provides an active device array, which includes a plurality of scan lines, a plurality of data lines, a plurality of pixel structures, a first testing circuit, a second testing circuit, a third testing circuit and a fourth testing circuit. The scan lines are arranged parallel to each other. A first region and a second region opposite to each other are defined in the extension direction of the scan lines. The extension direction of the data lines intersects the extension direction of the scan lines, and the data lines are located between the first region and the second region. The pixel structures are located between the first region and the second region, and each of the pixel structures is driven by one of the scan lines and one of the data lines. The first testing circuit is located at the first region and electrically connected to the odd scan lines; the second testing circuit is located at the first region and electrically connected to the (4n+1)th scan lines wherein n is zero or a positive integer; the third testing circuit is located at the second region and electrically connected to the even scan lines; the fourth testing circuit is located at the second region and electrically connected to the (4n+2)th scan lines.

The present invention also provides a testing method for testing the above-mentioned active device array. The testing method includes following steps: transmitting a first testing signal into the odd scan lines from the first testing circuit and judging whether or not a part of the pixel structures connected to the odd scan lines is turned on; transmitting a second testing signal into the (4n+1)th scan lines from the second testing circuit, wherein when the part of the pixel structures connected to the (4n+3)th scan lines is turned on, it is concluded that a defect is presented; transmitting a third testing signal into the even scan lines from the third testing circuit and judging whether or not a part of the pixel structures connected to the even scan lines is turned on; transmitting a fourth testing signal into the (4n+2)th scan lines from the fourth testing circuit, wherein when the part of the pixel structures connected to the (4n+4)th scan lines is turned on, it is concluded that a defect is presented.

Based on the depiction above, the active device array and the testing method of the present invention can effectively inspect the defects in the circuits, which is conducive to advance the production yield.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a diagram of an active device array according to an embodiment of the present invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of an active device array according to an embodiment of the present invention. Referring to FIG. 1, an active device array 100 includes a plurality of scan lines 110, a plurality of data lines 120, a plurality of pixel structures 130, a first testing circuit 140, a second testing circuit 150, a third testing circuit 160 and a fourth testing circuit 170. The scan lines 110 are parallel to each other. A first region R1 and a second region R2 are defined oppositely in the extension direction of the scan lines. In other words, the first region R1 and the second region R2 are respectively located at two opposite ends on the extensions of the scan lines 110. The extension direction of the data lines 120 intersects the extension direction of the scan lines 110, and the data lines 120 are located between the first region R1 and the second region R2. The pixel structures 130 are located between the first region R1 and the second region R2 as well, and each of the pixel structures 130 is driven by one of the scan lines 110 and one of the data lines 120.

With a display panel in which the active device array 100 is used, the pixel structures 130 serve as the major devices for displaying. Therefore, the region where the pixel structures 130 are located serves as, for example, a displaying region (not shown), and the first region R1 and the second region R2 are two non-displaying regions (not shown) not in charge of displaying frames. In fact, each of the pixel structures 130 respectively includes, for example, an active device 132 and a pixel electrode 134.

The first testing circuit 140 is located at the first region R1 and electrically connected to the odd scan lines 110. The second testing circuit 150 is located at the first region R1 and electrically connected to the (4n+1)th scan lines 110. The third testing circuit 160 is located at the second region R2 and electrically connected to the even scan lines 110. The fourth testing circuit 170 is located at the second region R2 and electrically connected to the (4n+2)th scan lines 110.

In the embodiment, the first testing circuit 140 and the third testing circuit 160 consist of, for example, similar parts. The first testing circuit 140 includes a first testing wire 142, a first testing pad 144 and a plurality of first testing switches 146, wherein the first testing pad 144 is located at an end of the first testing wire 142, and the first testing switches 146 are connected between the odd scan lines 110 and the first testing wire 142, so that a first testing signal Go is transmitted to the odd scan lines 110 via the first testing pad 144, the first testing wire 142, and the first testing switches 146.

The third testing circuit 160 includes a third testing wire 162, a third testing pad 164 and a plurality of third testing switches 166. The wiring of the parts in the third testing circuit 160 are similar to the one in the first testing circuit 140 except that the third testing circuit 160 is electrically connected to the even scan lines 110. In other words, a third testing signal Ge is transmitted to the even scan lines 110 via the third testing pad 164, the third testing wire 162, and the third testing switches 166.

In the embodiment, the first testing switches 146 and the third testing switches 166 control the circuits to decide whether or not the first testing signal Go and the third testing signal Ge are transmitted to the corresponding scan lines 110. Both the first testing switches 146 and the third testing switches 166 comprise a plurality of transistor devices. In other embodiments, however, the first testing switches 146 and the third testing switches 166 can also comprise other devices with switching functions.

The second testing circuit 150 has the similar design to the fourth testing circuit 170. In more details, the second testing circuit 150 includes a second testing wire 152, a second testing pad 154, and a plurality of second testing switches 156, wherein the second testing pad 154 is located at an end of the second testing wire 152, and the second testing switches 156 are connected between the (4n+1)th scan lines 110 and the second testing wire 152, so that a second testing signal Goh is transmitted to the (4n+1)th scan lines 110 via the second testing pad 154, the second testing wire 152, and the second testing switches 156.

Similarly to the depiction above, the fourth testing circuit 170 includes a fourth testing wire 172, a fourth testing pad 174, and a plurality of fourth testing switches 176, and the wiring of the devices is similar to the design of the second testing circuit 150. However, the design of the fourth testing circuit 170 enables a fourth testing signal Geh to be transmitted to the (4n+2)th scan lines 110 via the fourth testing pad 174, the fourth testing wire 172, and the fourth testing switches 176. The second testing switches 156 and the fourth testing switches 176 herein are, for example, a plurality of diode devices, which the present invention is not limited to.

The first testing circuit 140 and the third testing circuit 160 are able to deliver regular testing signals (Go and Ge) for respectively testing the pixel structures 130 connecting the odd scan lines 110 (i.e., the pixel structures 130 of the odd columns) and the pixel structures 130 connecting the even scan lines 110 (i.e., the pixel structures 130 of the even columns). Once an open-circuit defect occurs in the pixel structures 130 of the odd columns, the defect can be tested and inspected by the first testing circuit 140; once an open-circuit defect occurs in the pixel structures 130 of the even columns, the defect can be tested and inspected by the third testing circuit 160. Besides, once a short-circuit defect occurs between any two adjacent columns of the pixel structures 130, the defect can be tested and inspected by both the first testing circuit 140 and the third testing circuit 160.

For example, when the first testing circuit 140 conducts testing, the first testing signal Go ought be transmitted to the odd scan lines 110 only, which means the pixel structures 130 of the odd columns are turned on. At the time, if anyone of the pixel structures 130 of the odd columns is not turned on, it indicates an open-circuit defect occurs. Meanwhile, if anyone of the pixel structures 130 of the even columns is turned on, it indicates a short-circuit defect occurs. Similarly, when the third testing circuit 160 conducts testing, the third testing signal Gh ought make the pixel structures 130 of the even columns turned on without making the pixel structures 130 of the odd columns turned on. At the time, if anyone of the pixel structures 130 of the odd columns is turned on, it indicates a short-circuit defect occurs.

It should be noted that the first testing circuit 140 is able to transmit the first testing signal Go to both the first scan line 110 and the third scan line 110, so that the first testing circuit 140 is unable to inspect a short-circuit between the first and the third scan lines 110, i.e., the first testing circuit 140 is unable to inspect a short-circuit between two odd scan lines 110.

In order to solve the above-mentioned problem, the second testing circuit 150 and the fourth testing circuit 170 respectively connect every other four scan lines 110. In this way, if a short-circuit occurs between the odd scan lines 110 or a short-circuit occurs between the even scan lines 110, the second testing circuit 150 and the fourth testing circuit 170 used to conduct the testing are apt to inspect the short circuit.

For example, when the second testing circuit 150 conducts testing, the second testing signal Goh would be transmitted to the first, the fifth . . . the (4n+1)th scan lines 110 so that the pixel structures 130 of the first column, the fifth column . . . the (4n+1)th column are turned on. At the time, if a short-circuit occurs between the first and the third scan lines 110, the pixel structures 130 of the third column are turned on as well, so that a short-circuit occurring between the odd scan lines 110 can be effectively inspected. Similarly, a short-circuit occurring between the even scan lines 110 can be effectively inspected by using the fourth testing circuit 170 to conduct testing. In the embodiment, the first testing signal Go and the third testing signal Ge can be the same, and the second testing signal Goh and the fourth testing signal Geh can be the same as well.

It should be noted that due to the design of a practical structure, the short-circuit between the odd scan lines 110 and the short-circuit between the even scan lines 110 are often inevitable. The major reason to cause the short-circuit is mainly related to the structure. The active device array 100 further includes a plurality of first transmission circuits 180 and a plurality of second transmission circuits 190, wherein the first transmission circuits 180 are located in the first region R1 and connect the odd scan lines 110; the second transmission circuits 190 are located in the second region R2 and connect the even scan lines 110.

The first transmission circuits 180 and the second transmission circuits 190 are respectively connected to the driving chips (not shown) used for driving the active device array 100 and transmit the driving signals provided by the driving chips to the corresponding scan lines 110. Hence, each of the first transmission circuits 180 should be electrically independent from each other, and each of the second transmission circuits 190 should be electrically independent from each other too, so that the active device array 100 can run normally.

Since the first region R1 and the second region R2 are not for displaying, in terms of the structure design the widths of the first region R1 and the second region R2 must be as narrow as possible so as to save the area occupied by the non-displaying regions and increase the area of the displaying regions. As a result, the first transmission circuits 180 and the second transmission circuits 190 should be arranged closely, which, however, make the first transmission circuits 180 and the second transmission circuits 190 easily produce short-circuit defects due to a process error.

A short-circuit occurring between two adjacent first transmission circuits 180 indicates a short-circuit occurs between the odd scan lines 110, while a short-circuit occurring between two adjacent second transmission circuits 190 indicates a short-circuit occurs between the even scan lines 110. The above-mentioned short-circuits are unable to be inspected by the first testing circuit 140 and the third testing circuit 160. However, the second testing circuit 150 and the fourth testing circuit 170 employed by the embodiment can effectively overcome the problem and inspect the above-mentioned short-circuit defects, which is helpful to advance the production yield of the active device array 100.

In addition to the above-mentioned devices, the active device array 100 can further include a first testing circuit of data lines 122 and a second testing circuit of data lines 124, which are respectively connected to the odd data lines 120 and the even data lines 120. The first testing circuit of data lines 122 and the second testing circuit of data lines 124 are used to transmit the corresponding testing signals into the data lines 120. Besides, the active device array 100 further disposes a common circuit corn, which and the pixel electrodes 134 together construct a plurality of storage capacitors Cs. To drive the testing switches of the testing circuits, the active device array 100 further disposes a switching circuit SW to control the testing switches for turning on and turning off.

In summary, in the active device array of the present invention, a second testing circuit and a fourth testing circuit are disposed for respectively testing the possible short-circuit defects occurring between the odd scan lines, between the transmission wires and between the even scan lines. In this way, the active device array and the testing method provided by the present invention are able to reduce the cost burden caused by the circuit defects inspected after the assembling in the prior art. The active device array of the present invention accordingly has good production yield.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. An active device array, comprising:

a plurality of scan lines, parallel to each other, and a first region and a second region opposite to each other being defined in the extension direction of the scan lines;

a plurality of data lines, wherein an extension direction of the data lines intersects the extension direction of the scan lines, and the data lines are located between the first region and the second region;

a plurality of pixel structures, located between the first region and the second region, wherein each of the pixel structures is driven by one of the scan lines and one of the data lines;

a first testing circuit, located at the first region and electrically connected to the odd scan lines of the plurality of scan lines;

a second testing circuit, located at the first region and electrically connected exclusively to the first scan line as well as every (4n+1)th scan line among the plurality of scan lines, wherein n is a positive integer;

a third testing circuit, located at the second region and electrically connected to the even scan lines of the plurality of scan lines; and fourth testing circuit, located at the second region and electrically connected exclusively to the second scan line as well as every (4n+2)th scan line among the plurality of scan lines.

2. The active device array as claimed in claim 1, wherein the first testing circuit comprises:

a first testing wire;

a first testing pad, located at an end of the first testing wire; and a plurality of first testing switches, connected between the odd scan lines and the first testing wire.

3. The active device array as claimed in claim 2, wherein the first testing switches are a plurality of transistor devices.

4. The active device array as claimed in claim 1, wherein the second testing circuit comprises:

a second testing wire;

a second testing pad, located at an end of the second testing wire; and a plurality of second testing switches, connected between the (4n+1)th scan lines and the second testing wire.

5. The active device array as claimed in claim 4, wherein the second testing switches are a plurality of diode devices.

6. The active device array as claimed in claim 1, wherein the third testing circuit comprises:

a third testing wire;

a third testing pad, located at an end of the third testing wire; and a plurality of third testing switches, connected between the even scan lines and the third testing wire.

7. The active device array as claimed in claim 6, wherein the third testing switches are a plurality of transistor devices.

8. The active device array as claimed in claim 1, wherein the fourth testing circuit comprises:

a fourth testing wire;

a fourth testing pad, located at an end of the fourth testing wire; and a plurality of fourth testing switches, connected between the (4n+2)th scan lines and the fourth testing wire.

9. The active device array as claimed in claim 8, wherein the fourth testing switches are a plurality of diode devices.

10. A testing method, for testing the active device array as claimed in claim 1; the testing method comprising:

transmitting a first testing signal into the odd scan lines from the first testing circuit and judging whether or not a part of the pixel structures connected to the odd scan lines is turned on;

transmitting a second testing signal into the (4n+1)th scan lines from the second testing circuit, wherein when the part of the pixel structures connected to (4n+3)th scan lines is turned on, it is concluded that a defect is presented;

transmitting a third testing signal into the even scan lines from the third testing circuit and judging whether or not a part of the pixel structures connected to the even scan lines is turned on; and transmitting a fourth testing signal into the (4n+2)th scan lines from the fourth testing circuit, wherein when the part of the pixel structures connected to the (4n+4)th scan lines is turned on, it is concluded that a defect is presented.

* * * * *